United States Patent
Hrehor, Jr. et al.

(10) Patent No.: US 9,459,669 B2
(45) Date of Patent: Oct. 4, 2016

(54) MULTI-COMPONENT SHARED COOLING SYSTEM

(71) Applicant: Dell Products L.P., Round Rock, TX (US)

(72) Inventors: Robert D. Hrehor, Jr., Round Rock, TX (US); Travis Christian North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 174 days.

(21) Appl. No.: 14/166,351

(22) Filed: Jan. 28, 2014

(65) Prior Publication Data

US 2015/0212556 A1    Jul. 30, 2015

(51) Int. Cl.
*G06F 1/20* (2006.01)
*H05K 7/20* (2006.01)
*H01L 23/427* (2006.01)

(52) U.S. Cl.
CPC .............. *G06F 1/20* (2013.01); *H01L 23/427* (2013.01); *H05K 7/20336* (2013.01); *H05K 7/20809* (2013.01)

(58) Field of Classification Search
CPC ................... G06F 1/20–1/203; H01L 23/427; H05K 7/20336; H05K 7/20672; H05K 7/20809
See application file for complete search history.

(56) References Cited

U.S. PATENT DOCUMENTS

| | | | | |
|---|---|---|---|---|
| 6,804,115 B2* | 10/2004 | Lai | ........................ | H05K 7/202 165/104.33 |
| 7,227,749 B2* | 6/2007 | Rockenfeller | ..... | H05K 7/20836 165/104.33 |
| 7,277,286 B2* | 10/2007 | Lee | ......... | H05K 7/209 174/15.2 |
| 7,317,614 B2* | 1/2008 | Ruch | ....................... | G06F 1/203 165/185 |
| 7,325,590 B2* | 2/2008 | Kim | ......................... | G06F 1/203 165/104.21 |
| 7,474,527 B2* | 1/2009 | Wu | ........................... | G06F 1/20 165/104.33 |
| 7,518,861 B2* | 4/2009 | Lev | ........................ | G06F 1/203 165/104.33 |
| 7,630,856 B2* | 12/2009 | Rockenfeller | ........... | G06F 1/206 361/688 |
| 7,675,752 B2* | 3/2010 | Hongo | .................... | G06F 1/203 165/121 |
| 7,710,724 B2* | 5/2010 | Takeguchi | .............. | G06F 1/203 165/104.33 |
| 7,800,906 B2* | 9/2010 | Chang | ........................ | G06F 1/20 165/104.26 |
| 7,952,878 B2* | 5/2011 | Lian | .................... | H01L 23/4006 165/104.33 |
| 7,961,467 B2* | 6/2011 | Hongo | .................... | G06F 1/203 165/104.26 |

(Continued)

*Primary Examiner* — Robert J Hoffberg
(74) *Attorney, Agent, or Firm* — Haynes and Boone, LLP

(57) ABSTRACT

Multi-component shared cooling systems include a chassis housing a first heat exchanger device and a second heat exchanger device. A first component such as, for example, a system processor, is housed in the chassis, includes a first thermal connection to the first heat exchanger device, and includes a second thermal connection to the second heat exchanger device. A second component such as, for example, a graphics processor, is housed in the chassis and includes a third thermal connection to the first heat exchanger device. The first heat exchanger device is configured to dissipate heat that is produced by the second component and transmitted by the third thermal connection. The second heat exchanger device is configured to dissipate the heat that is produced by the second component and transmitted by the third thermal connection, the first heat exchanger device, the first thermal connection, the first component, and the second thermal connection.

20 Claims, 10 Drawing Sheets

(56) References Cited

U.S. PATENT DOCUMENTS

| | | | | |
|---|---|---|---|---|
| 7,965,512 B2* | 6/2011 | Huang | ................ | F28D 15/0266 |
| | | | | 165/104.33 |
| 8,400,766 B2* | 3/2013 | Kim | .................... | H05K 7/20181 |
| | | | | 361/679.47 |
| 8,493,737 B2* | 7/2013 | Abe | ...................... | H01L 23/427 |
| | | | | 165/104.33 |
| 8,553,415 B2* | 10/2013 | Wang | ...................... | G06F 1/203 |
| | | | | 165/185 |
| 8,743,541 B2* | 6/2014 | Hata | .................. | H05K 7/20972 |
| | | | | 165/80.4 |
| 8,743,547 B2* | 6/2014 | Kim | ...................... | G06F 1/1633 |
| | | | | 174/15.2 |
| 8,964,383 B2* | 2/2015 | Degner | ................... | G06F 1/203 |
| | | | | 165/104.33 |
| 9,087,804 B2* | 7/2015 | Wong | ...................... | H01L 23/34 |
| 2008/0218961 A1* | 9/2008 | Wu | .......................... | G06F 1/20 |
| | | | | 361/679.52 |
| 2011/0075360 A1* | 3/2011 | Tomioka | ................... | G06F 1/20 |
| | | | | 361/695 |
| 2013/0329357 A1* | 12/2013 | Degner | ................... | H05K 5/02 |
| | | | | 361/679.47 |
| 2015/0043167 A1* | 2/2015 | Guenin | ............... | H01L 23/3672 |
| | | | | 361/719 |
| 2015/0043168 A1* | 2/2015 | Douglas | .................. | H01L 23/00 |
| | | | | 361/719 |
| 2015/0084490 A1* | 3/2015 | Fujiwara | ............... | G06F 1/1613 |
| | | | | 312/236 |

* cited by examiner

MULTI-COMPONENT SHARED COOLING SYSTEM

BACKGROUND

The present disclosure relates generally to information handling systems, and more particularly to a shared cooling system for multiple components in an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs typically include cooling systems for cooling components in the IHS chassis. For example, a processor in an IHS chassis is typically coupled to a cooling system that includes a heat sink coupled to the processor, and a fan located adjacent the heat sink. During operation of the processor, heat produced by the processor is transmitted from the processor and to the heat sink, and the operation of the fan produces airflow through the heat sink that allows for heat produced by the processor to be continuously drawn away from the processor to keep it cool. However, IHSs may include multiple heat producing components that each require cooling. For example, an IHS chassis may house both a system processor and a graphics processor, each of which may be coupled to a separate cooling system including a respective heat sink, as discussed above. In such an example, each of those cooling systems contribute to a system weight and cost, as well as a reduction in supported thermal power. Furthermore, situations where volume in the IHS chassis is limited and a fan is used, the separate heat sinks used by the system processor and graphics processor may be stacked (i.e., positioned side-by-side) such that a single fan may provide airflow through both heat sinks. In such situations, one of those heat sinks will receive the airflow that has been heated by the other heat sink, reducing the cooling capacity of the cooling system.

Accordingly, it would be desirable to provide an improved cooling system for multiple components.

SUMMARY

According to one embodiment, an information handling system (IHS) includes an IHS chassis; a first heat exchanger device that is housed in the IHS chassis; a second heat exchanger device that is housed in the IHS chassis; a first IHS component that is housed in the IHS chassis, includes a first thermal connection to the first heat exchanger device, and includes a second thermal connection to the second heat exchanger device; and a second IHS component that is housed in the IHS chassis and that includes a third thermal connection to the first heat exchanger device, wherein the first heat exchanger device is configured to dissipate heat that is produced by the second IHS component and that is transmitted by the third thermal connection, and the second heat exchanger device is configured to dissipate the heat that is produced by the second IHS component and that is transmitted by the third thermal connection, the first heat exchanger device, the first thermal connection, the first IHS component, and the second thermal connection.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
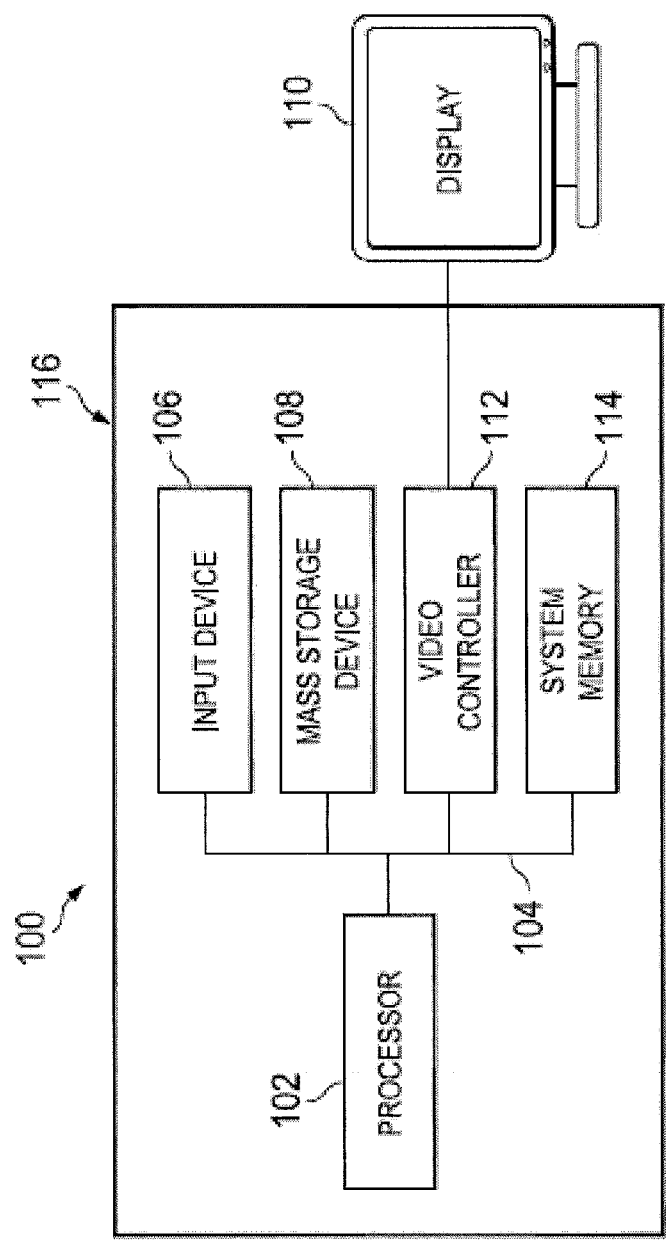
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
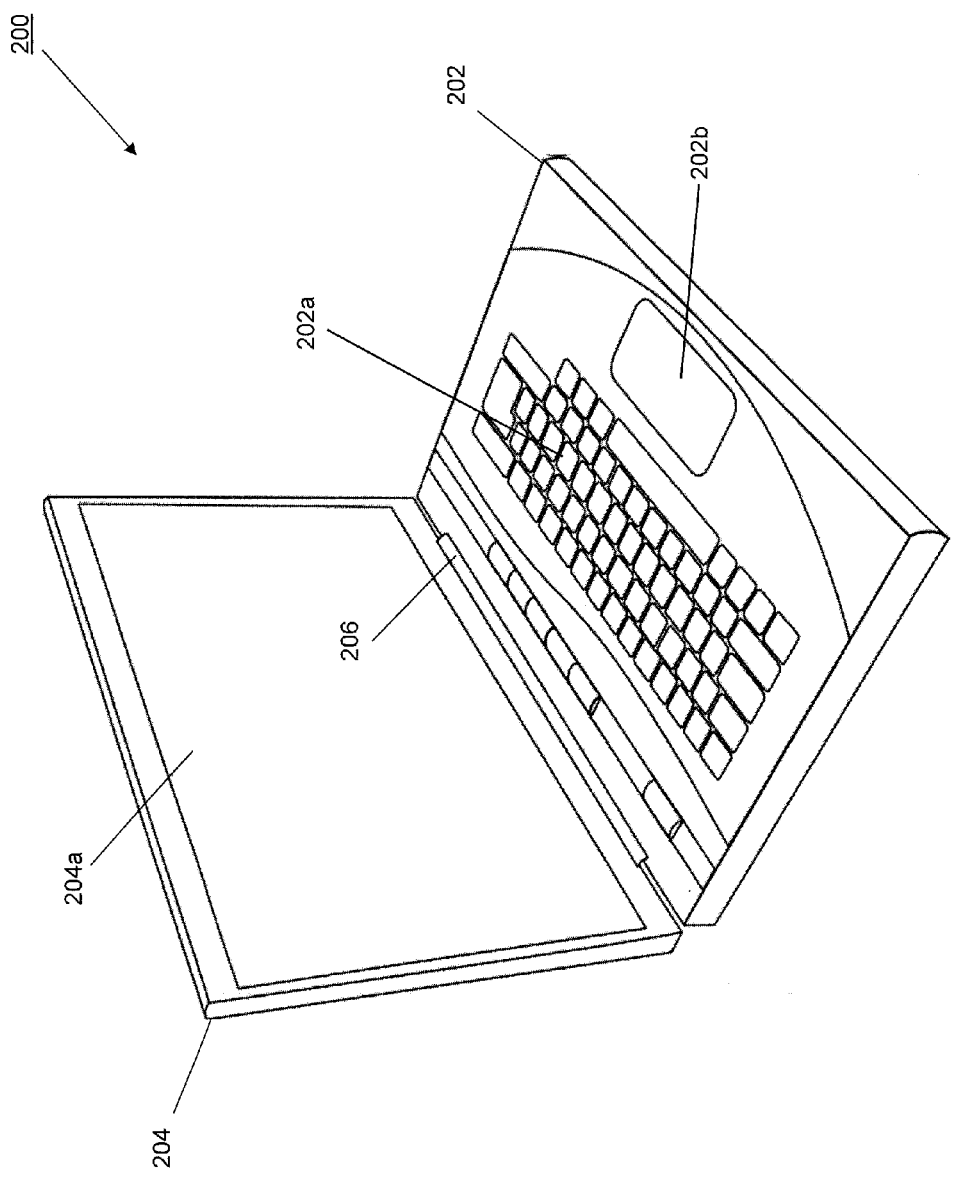
FIG. 2 is a perspective view illustrating an embodiment of an information handling system.

Referring now to FIG. 2, an embodiment of an IHS 200 is illustrated. One of skill in the art will recognize that the IHS 200 illustrated in FIG. 2 is a portable IHS such as a laptop and/or notebook computer. However, one of skill in the art in possession of the present disclosure will recognize that a wide variety of IHSs including server IHSs, switch IHSs, storage IHSs, desktop IHSs, gaming IHSs, tablet IHSs, phone IHSs, and/or other IHSs known in the art will benefit from the teachings of the present disclosure and thus will fall within its scope. The IHS 200 includes a base portion 202 that is moveably coupled to a display portion 204 by a hinge 206. In the illustrated embodiment, the base portion 202 includes a keyboard 202a and touchpad 202b, and may include any other IHS 200 features known in the art. Furthermore, the base portion 202 may house a variety of IHS components such as, for example, circuit boards, processing systems, memory systems, cooling systems, power supply systems, and/or any other IHS components known in the art. The display portion 204 includes a display device 204a that may be coupled to IHS components in the base portion 202.

Figure 3:
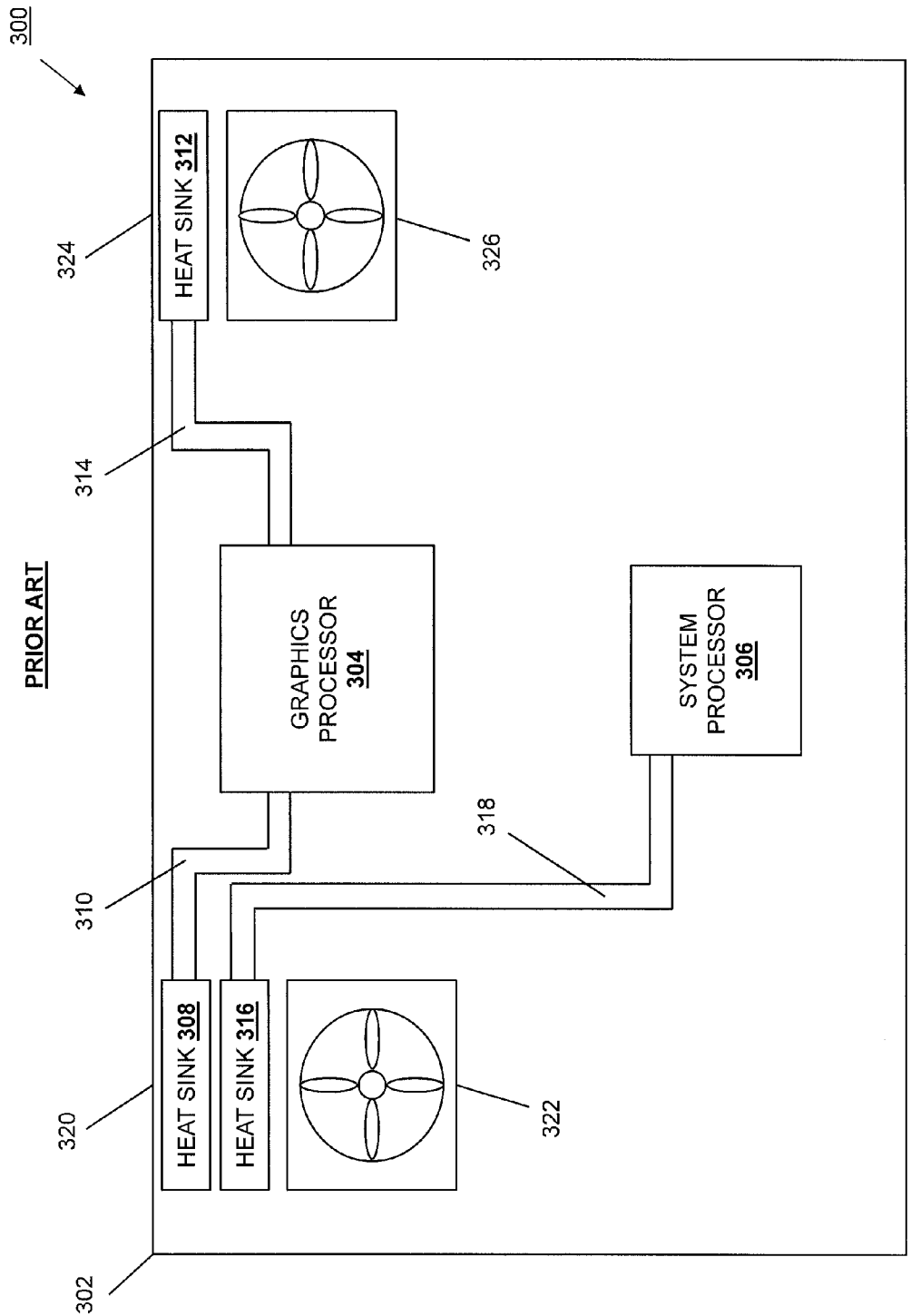
FIG. 3 is a schematic view illustrating an embodiment of a prior art cooling system.

Referring now to FIG. 3, an embodiment of a prior art IHS 300 is illustrated. The portion of the IHS 300 illustrated in FIG. 3 includes a base portion 302 that may be, for example, the base portion 202 discussed above with reference to FIG. 2. As discussed above, the base portion 302 may house a variety of IHS components. For example, FIG. 3 illustrates the base portion 302 of the prior art IHS 300 housing a graphics processor 304 and a system processor 306, each coupled to a processor cooling system. In the illustrated embodiment, the processor cooling system for the graphics processor 304 includes a first heat sink 308 that is connected to the graphics processor 304 by a first heat pipe 310, and a second heat sink 312 that is connected to the graphics processor 304 by a second heat pipe 314. Furthermore, the processor cooling system for the system processor 306 includes a third heat sink 316 that is connected to the system processor 306 by a third heat pipe 318. The first heat sink 308 and the third heat sink 316 are positioned adjacent each other and between a vent 320 on the base portion 302 and a fan 322. The third heat sink 312 is positioned between a vent 324 on the base portion 302 and a fan 326. The prior art IHS 300 illustrated in FIG. 3 was utilized in experimental embodiments, discussed in further detail below, to determine the cooling improvement provided by the teachings of the present disclosure.

Figure 4:
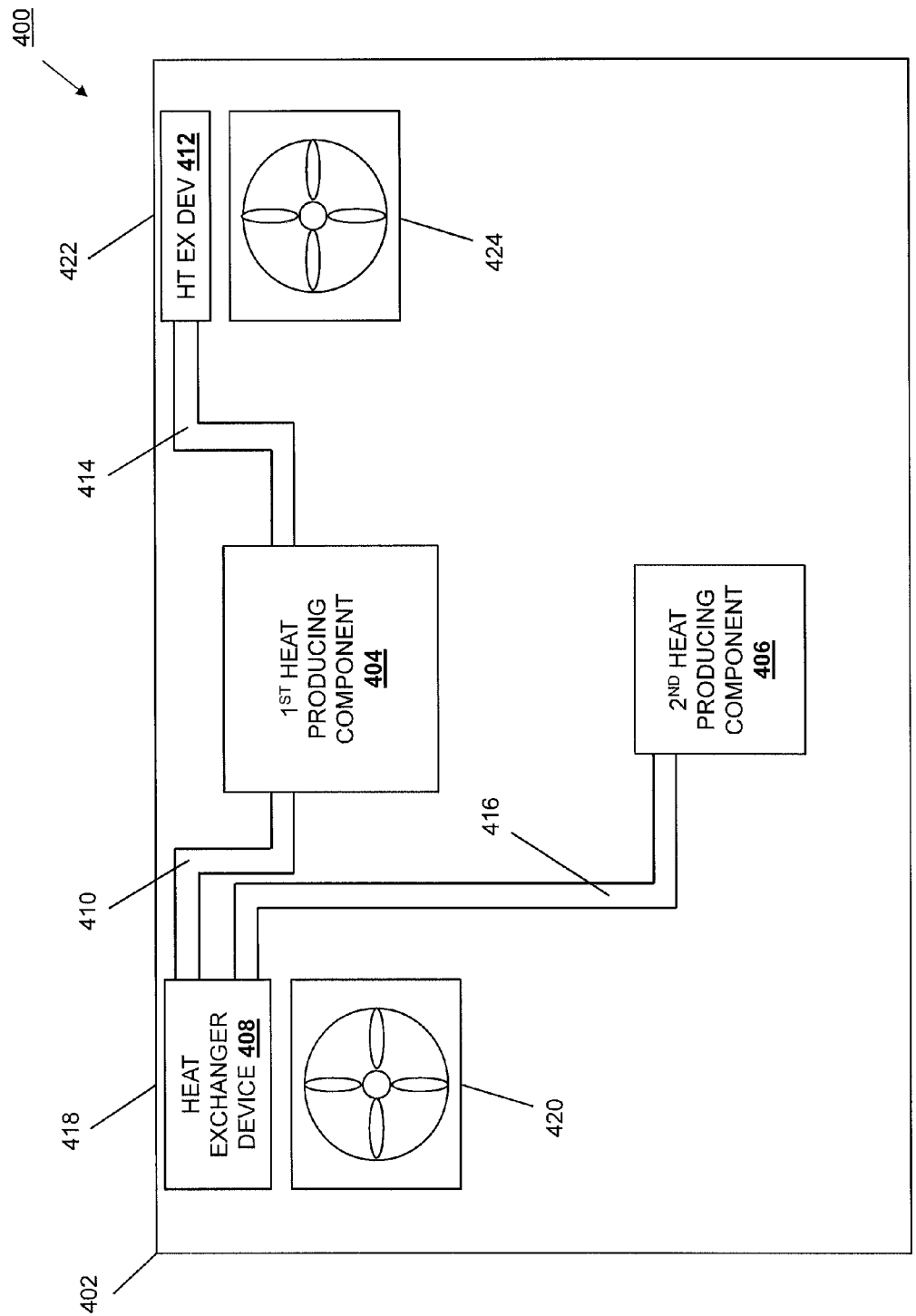
FIG. 4 is a schematic view illustrating an embodiment of a cooling system according to the teachings of the present disclosure.

Referring now to FIG. 4, an embodiment of an IHS 400 is illustrated that incorporates a component cooling system according to the teachings of the present disclosure. While the present disclosure describes an IHS that incorporates the component cooling system of the present disclosure, one of skill in the art in possession of the present disclosure will recognize that the component cooling system may be incorporated into almost any multi-heat-producing component system while remaining within the scope of the present disclosure. The portion of the IHS 400 illustrated in FIG. 4 includes a base portion 402 that may be, for example, the base portion 202 discussed above with reference to FIG. 2. As discussed above, the base portion 402 may house a variety of IHS components. For example, FIG. 4 illustrates the base portion 402 of the IHS 400 housing a first heat producing component 404 and a second heat producing component 406 each connected to a cooling system. In an embodiment, the first heat producing component 404 may be a first IHS component such as, for example, a system processor, a graphics processor, a memory device, a power supply system, and/or a variety of other heat producing IHS components known in the art. Similarly, the second heat producing component 406 may be a second IHS component such as, for example, a system processor, a graphics processor, a memory device, a power supply system, and/or a variety of other heat producing IHS components known in the art. In the experimental embodiments discussed below, the first heat producing component 404 is a graphics processor and the second heat producing component 406 is a system processor, but one of skill in the art will recognize that any variety of heat producing components will benefit from the teachings of the present disclosure and thus will fall within its scope.

In the illustrated embodiment, the cooling system includes a first heat exchanger device 408 that is thermally connected to the first heat producing component 404 by a first thermal connection 410, a second heat exchanger device 412 that is thermally connected to the first heat producing component 404 by a second thermal connection 414, and a third thermal connection 416 that thermally connects the second heat producing component 406 to the first heat exchanger device 408. In an embodiment, the first heat exchanger device 408 and/or the second heat exchanger device 412 may include IHS heat sinks, double pipe heat exchangers, shell and tube heat exchangers, plate heat exchangers, plate and shell heat exchangers, adiabatic wheel heat exchangers, plate fin heat exchangers (e.g., micro channel fin, louvered fin, dimple fin, and/or other plate fin heat exchangers known in the art), pillow plate heat exchangers, fluid heat exchangers, waste heat recovery units, dynamic scraped surface heat exchangers, phase change heat exchangers, direct contact heat exchangers, spiral heat exchangers, thermal electric devices, and/or a variety of other heat exchanger devices known in the art. For example, in the embodiments discussed below, the first heat exchanger device 408 and the second heat exchanger device 412 are IHS heat sinks that each include a plurality of fins and that operate to dissipate heat to an airflow that is provided by a fan through the plurality of fins. However, the first heat exchanger device 408 and the second heat exchanger device 412 may also be IHS heat sinks that operate to dissipate heat without the use of an airflow.

In an embodiment, the first thermal connection 410, the second thermal connection 414, and/or the third thermal connection 416 may include heat pipes, heat pins, and/or other heat-transfer devices known in the art. In some embodiments, any of the thermal connections 410, 414, and 416 may be replaced with a direct thermal connection to the first heat exchanger device 408 or the second heat exchanger device 412. For example, the first heat producing component 404 may be directly thermally connected to the second heat exchanger device 412 (e.g., a heat sink positioned on and thermally coupled a processor via a thermal paste) and thermally connected to the first heat exchanger device 408 through the first thermal connection 408, with the second heat producing component 406 thermally connected to the first heat exchanger device 408 through the third thermal connection 416. In some embodiments, any or all of the thermal connections 410, 414, and 416 may include multiple heat transfer components such as, for example heat pins, heat pipes, heat exchangers, and/or other heat transfer components known in the art. The first heat exchanger device 408 is positioned between a vent 418 on the base portion 402 and a fan 420. The second heat exchanger device 412 is positioned between a vent 422 on the base portion 402 and a fan 424. However, in some embodiments, the fans 420 and 424 may be omitted (e.g., when the cooling requirements of the first heat producing component 404 and the second heat producing component 406 may be satisfied by the first heat exchanger device 408 and the second heat exchanger device 412 without the need for airflows provided by fans). The IHS 400 illustrated in FIG. 4 was utilized in experimental embodiments with a first heat producing component 404 that was substantially similar to the graphics processor 304 of in the prior art IHS 300 of FIG. 3 and a second heat producing component 406 that was substantially similar to the system processor 306 of in the prior art IHS 300 of FIG. 3, and it was found that the component cooling system illustrated in FIG. 4 greatly increased the cooling provided for the graphics processor and the base portion of the IHS, discussed in further detail below.

Figure 5:
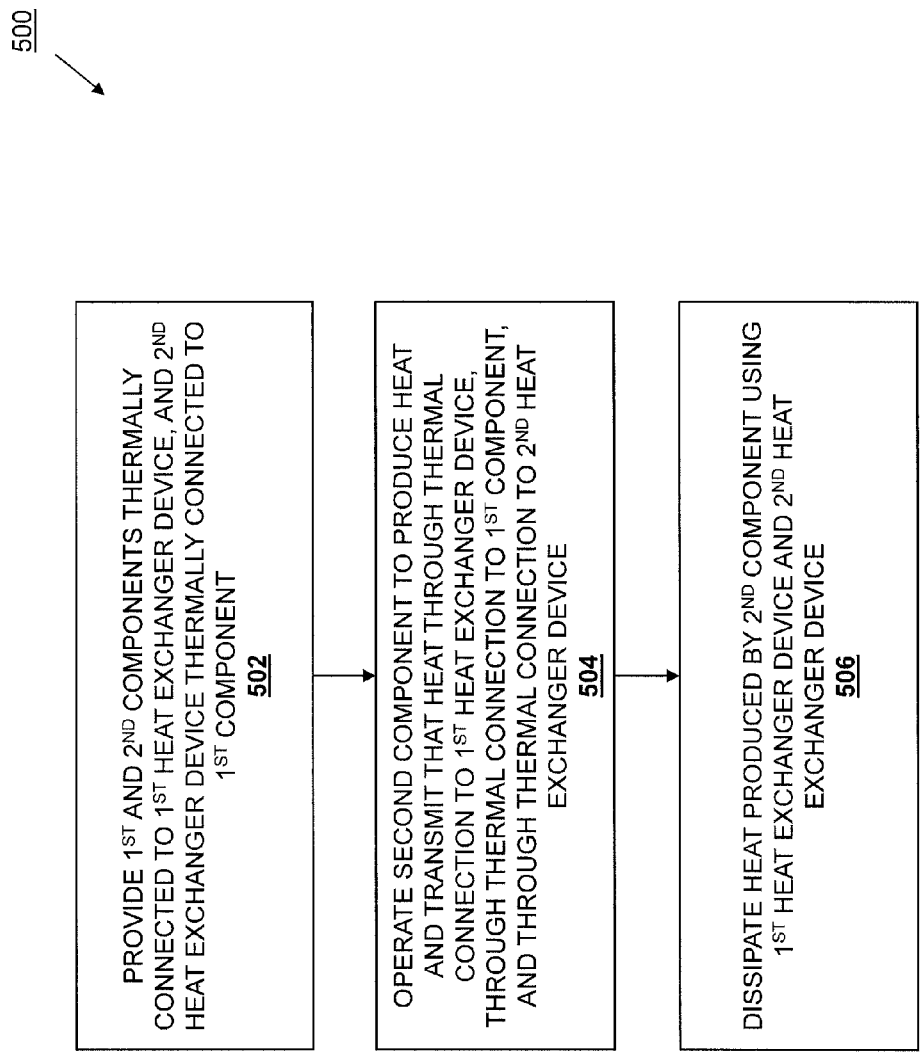
FIG. 5 is a flow chart illustrating an embodiment of a method for cooling a component.

Referring now to FIGS. 4 and 5, an embodiment of a method 500 for cooling components is illustrated. As discussed above, while the method 500 and experimental embodiments provided below are directed to the embodiments of the component cooling system, illustrated in FIG. 4, as implemented in the IHS 200, illustrated in FIG. 2, component cooling systems utilizing the teachings of the present disclosure may be implemented in a wide variety of systems and operate according to the method 500 while remaining within the scope of the present disclosure. The method 500 begins at block 502 where a first component and a second component are provided and each thermally connected to a first heat exchanger device, and a second heat exchanger device is provided that is thermally connected to the first component. In an embodiment, at block 502 of the method 500, the IHS 400 is provided that includes the component cooling system with the first heat producing component 404, the second heat producing component 406, the first heat exchanger device 408, and the second heat exchanger device 412. In the experimental embodiments discussed below, the IHS 400 was a portable laptop or notebook IHS (e.g., the IHS 200 illustrated in FIG. 2) having a graphics processor as the first heat producing component 404, a system processor as the second heat producing component 406, a first finned heat sink as the first heat exchanger device 408, and a second finned heat sink as the second heat exchanger device 412.

The method 500 then proceeds to block 504 where the second component is operated such that heat is produced by the second component and transmitted through a thermal connection to the first heat exchanger device, through a thermal connection from the first heat exchanger device to the first component, and through a thermal connection from the first component to the second heat exchanger device. In an embodiment, at block 504, the second heat producing component 406 in the IHS 400 is operated such that heat is produced. At least a portion of the heat produced by the second heat producing component 406 is then transmitted from the second heat producing component 406, through the thermal connection 416, and to the first heat exchanger device 408. At least a portion of that heat is then further transmitted from the first heat exchanger device 408, through the thermal connection 410, and to the first heat producing component 404. At least a portion of that heat is then further transmitted from the first heat producing component 404, through the thermal connection 414, and to the second heat exchanger device 412. In some embodiments of block 504, the first heat producing component 404 may also be operated to produce heat. In such embodiments, the heat produced by the first heat producing component 404 may be transmitted from the first heat producing component 404, through the thermal connection 410 to the first heat exchanger device 408, and/or through the thermal connection 414 to the second heat exchanger device 412.

For example, in an experimental embodiment, the IHS 400 was provided with a graphics processor as the first heat producing component 404, a system processor as the second heat producing component 406, a first finned heat sink as the first heat exchanger device 408, a second finned heat sink as the second heat exchanger device 412, and heat pipes as the thermal connections 410, 414, and 416. At block 504 of the method 500, the system processor in the IHS 400 was operated such that heat was produced, and least a portion of the heat produced by the system processor (406) was then transmitted from the system processor (406), through the heat pipe (416), and to the first finned heat sink (408). At least a portion of that heat was then further transmitted from the first finned heat sink (408), through the heat pipe (410), and to the graphics processor (404). At least a portion of that heat was then further transmitted from the graphics processor (404), through the heat pipe (414), and to the second finned heat sink (412).

The method 500 then proceeds to block 506 where heat produced by the second component is dissipated using the first heat exchanger device and the second heat exchanger device. While illustrated and described as separate method blocks, one of skill in the art will recognize that blocks 504 and 506 of the method 500 may be performed at substantially the same time, with the second heat producing component (and in some embodiments, the first heat producing component) producing heat such that that heat is transmitted to the first heat exchanger device and the second heat exchanger device, while the first heat exchanger device and the second heat exchanger device operate to dissipate heat that was transmitted by the second heat producing component (and in some embodiments, the first heat producing component). In an embodiment, at block 506, the first heat exchanger device 408 and the second heat exchanger device 412 may operate to dissipate heat transmitted during block 504 using an airflow provided by the fans 420 and 424. For example, the operation of the fan 420 at block 506 may produce an airflow through the first heat exchanger device 408 and out the vent 418 on the base portion 402, and the structure of the first heat exchanger device 408 may provide for the transfer of heat from the first heat exchanger device 408 to the airflow, which is then expelled from the base portion 402 through the vent 418. Similarly, the operation of the fan 424 at block 506 may produce an airflow through the second heat exchanger device 412 and out the vent 422 on the base portion 402, and the structure of the second heat exchanger device 412 may provide for the transfer of heat from the second heat exchanger device 412 to the airflow, which is then expelled from the base portion 402 through the vent 422. However, as discussed above, in some embodiments, the fans 420 and/or 424 may be omitted, and the first heat exchanger device 408 and the second heat exchanger device 412 may operate to dissipate heat without the use of airflows. For example, the structures of the first heat exchanger device 408 and the second heat exchanger device 412 may provide for the sufficient transfer of heat to the surroundings without the need for an airflow.

The performance of blocks 504 and 506 of the method 500 operates to provide for component level thermal load sharing in a component cooling system with a plurality of components. For example, as can be seen in the embodiment of FIG. 4, the thermal load on the component cooling system that is produced by the second heat producing component 406 is shared by the first heat producing component 404 and transmitted to the second heat exchanger device 412 that is connected to the first heat producing component 404. As discussed with reference to the experimental embodiments below, such component level thermal load sharing has been found to reduce component operating temperatures and IHS chassis skin temperatures, reduce cooling systems acoustic levels (e.g., fan noise), allow for longer periods of intensive processor operation, and/or provide a variety of other benefits over conventional systems that will be recognized by one of skill in the art.

Figure 6:
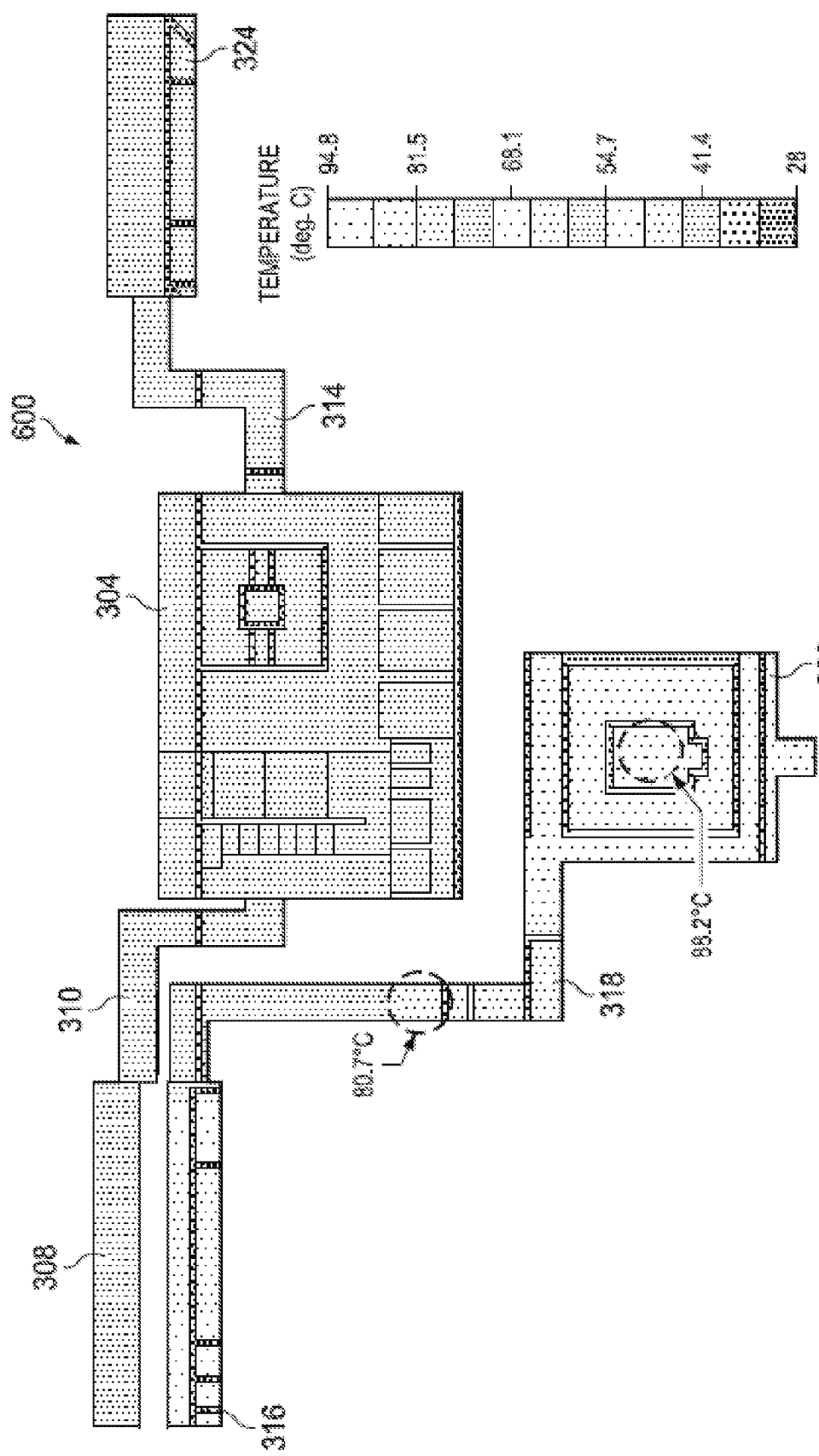
FIG. 6 is a temperature map illustrating an experimental embodiment of the prior art cooling system of FIG. 3.

Referring first to FIGS. 3, 4, 6, and 7, an experimental embodiment is provided that illustrates the increased cooling provided for the components in an IHS by the component cooling system of the present disclosure relative to conventional component cooling systems. FIG. 6 illustrates a temperature map 600 of the prior art IHS 300 of FIG. 3 including the graphics processor 304, system processor 306, heat sinks 308, 312, and 316, and heat pipes 310, 314, and 318. The temperature map 600 illustrates the differing surface temperatures across of each of the graphics processor 304, system processor 306, heat sinks 308, 312, and 316, and heat pipes 310, 314, and 318. In the experimental embodiment illustrated in FIG. 6, the system processor 306 performed a processing-intensive operation that caused the system processor 306 to produce heat. The heat produced by the system processor 306 was then transmitted through the heat pipe 318 to the heat sink 316, where that heat was then dissipated by the heat sink 316 along with the operation of the fan 322. As can be seen in FIG. 6, the operation of the system processor 306, the transmission of heat through the heat pipe 318 to the heat sink 316, and the dissipation of that heat by the heat sink 316 produced a surface temperature on the system processor 306 (at approximately the middle of the system processor 306) of 88.2 degrees C., and produced a surface temperature along the heat pipe 318 (at approximately midway along the heat pipe 318 between the system processor 306 and the heat sink 316) of 80.7 degrees C. The heat dissipation by the heat sink 316 is illustrated in FIG. 6 by the decreasing surface temperature along the heat sink 316 and away from its connection to the heat pipe 318.

Figure 7:
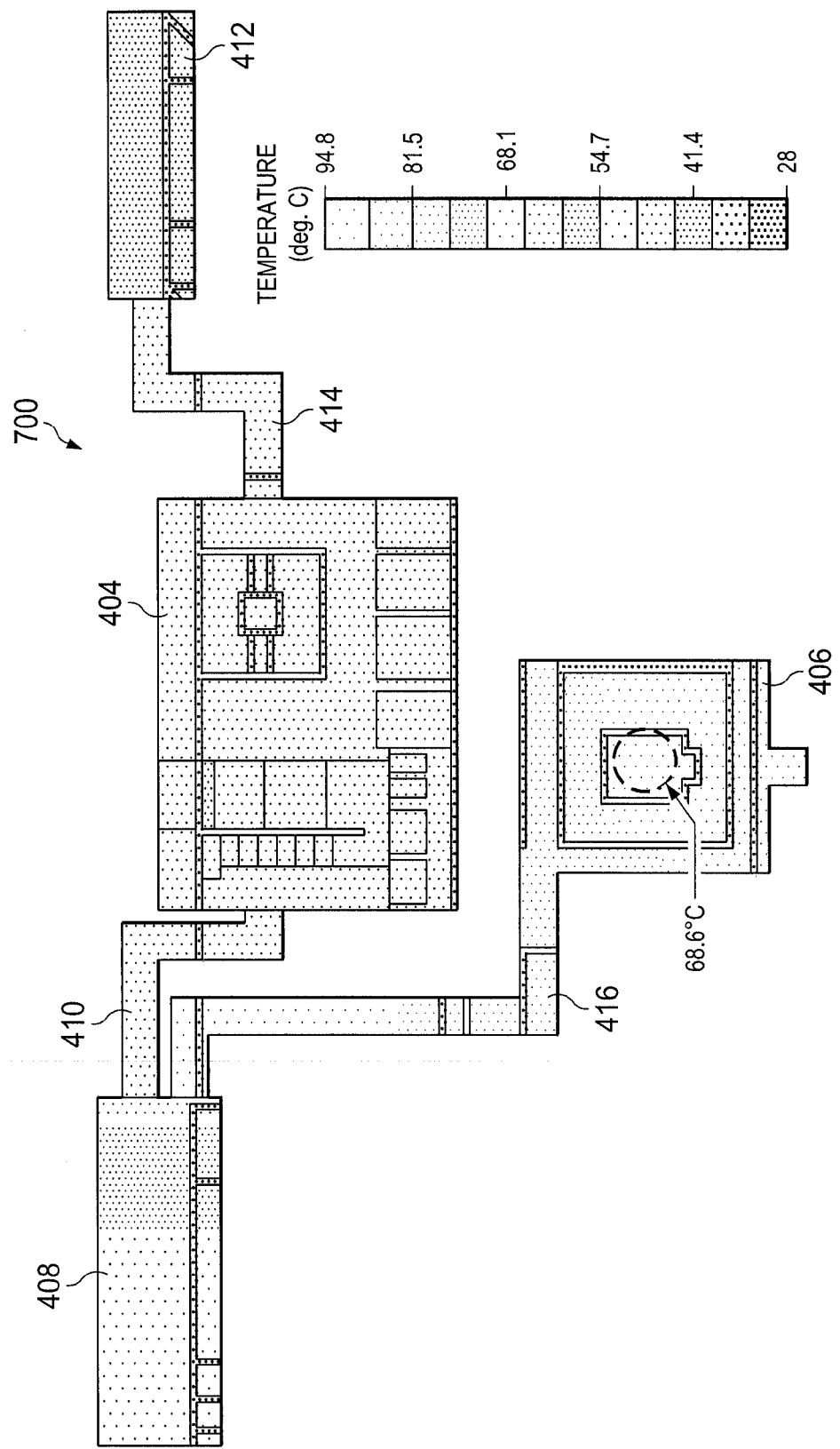
FIG. 7 is a temperature map illustrating an experimental embodiment of the cooling system of FIG. 4.

FIG. 7 illustrates a temperature map 700 of the IHS 400 of FIG. 4 including a graphics processor (404) that was substantially similar to the graphics processor 304 used for the experimental embodiment of FIG. 6, a system processor (406) that was substantially similar to the system processor 306 used for the experimental embodiment of FIG. 6, a first finned heat sink (408), a second finned heat sink (412), and heat pipes 410, 414, and 416. The temperature map 700 illustrates the differing surface temperatures across of each of the graphics processor (404), the system processor (406), the first finned heat sink (408), the second finned heat sink (412), and the heat pipes 410, 414, and 416. In the experimental embodiment illustrated in FIG. 7, the system processor (406) performed a processing-intensive operation that was substantially similar to the operation performed by the system processor 306 in the experimental embodiment of FIG. 6, and that operation caused the system processor (406) to produce heat. The heat produced by the system processor (406) was then transmitted through the heat pipe 416 to the first finned heat sink (408). A portion of that heat was then dissipated by the first finned heat sink (408) along with the operation of the fan 420, while a portion of that heat was transmitted through the heat pipe 410, through the graphics processor (404), through the heat pipe 414, and to the second finned heat sink (412) where that portion of the heat was then dissipated by the second finned heat sink (412) along with the operation of the fan 424. As can be seen in FIG. 7, the operation of the system processor (406), the transmission of heat through the heat pipe 416 to the first finned heat sink (408), the dissipation of a portion of that heat by the first finned heat sink (408), the transmission of a portion of that heat through the heat pipe 410, the graphics processor (404), the heat pipe 404, and the second finned heat sink (412), and the dissipation of that portion of the heat by the second finned heat sink (412) produced a surface temperature on the system processor (406) (at approximately the middle of the system processor (406)) of 68.6 degrees C.

Thus, as can be seen by comparing the temperature maps 600 and 700 of FIGS. 6 and 7, respectively, the component cooling system of the present disclosure operates to share the thermal load of a component that is producing heat with other components in the system to lower the temperature of that component that is producing heat. In the experimental embodiments illustrated in FIGS. 6 and 7, the component cooling system operated to reduce the temperature of the system processor (e.g., the system processor 306 in a prior art component cooling system of a prior art IHS relative to the system processor (406) in the component cooling system of an IHS of the present disclosure) 19.6 degrees C. when performing substantially similar processing operations. Furthermore, as can be seen by comparing the temperature maps 600 and 700 of FIGS. 6 and 7, the component cooling system of the present disclosure operates to provide for more distributed heat across the components in the IHS to reduce or eliminate "hot" components (e.g., the distribution of heat produced by the system processor 406 across the graphics processor (404), the first finned heat sink (408), the second finned heat sink (412), and the heat pipes 410, 414, and 416 to provide, for example, a lower temperature heat pipe 416 relative to the similar heat pipe 318 in FIG. 6).

Figure 8:
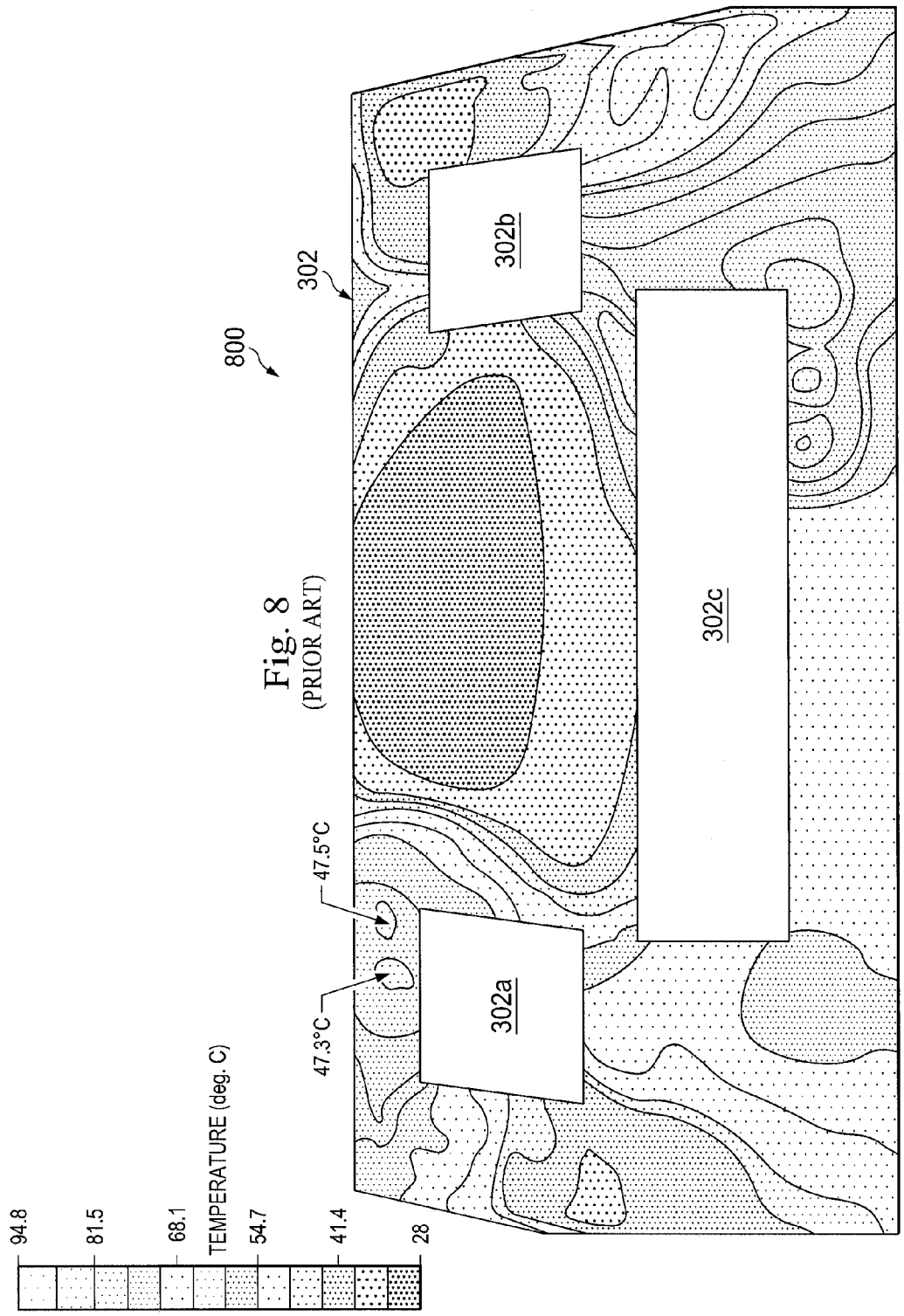
FIG. 8 is a temperature map illustrating an experimental embodiment of a wall of the IHS of FIG. 2 that incorporates the prior art cooling system of FIG. 3.

Referring now to FIGS. 3, 4, 8, and 9, an experimental embodiment is provided that illustrates the increased cooling provided for wall temperatures on an IHS by the component cooling system of the present disclosure relative to conventional component cooling systems. FIG. 8 illustrates a temperature map 800 of a wall (e.g., a bottom wall) on the base portion 302 of the prior art IHS 300 of FIG. 3 with the system processor 306 performing the processing-intensive operation discussed above with reference to FIG. 6. The base portion 302 includes a plurality of vent sections 302a, 302b, and 302c used, for example, to provide for an airflow into the base portion 302 to the system processor 306 and fans 322 and 326. As such, there is no temperature data for those sections of the wall on the base portion 302. As can be seen in FIG. 8, a section of the wall on the base portion 302, which is located adjacent the vent section 302a and immediately adjacent the heat sink 316 in the base portion 302, increases in temperature to approximately 47.3-47.5 degrees C. during the operation of the graphics processor 304.

Figure 9:
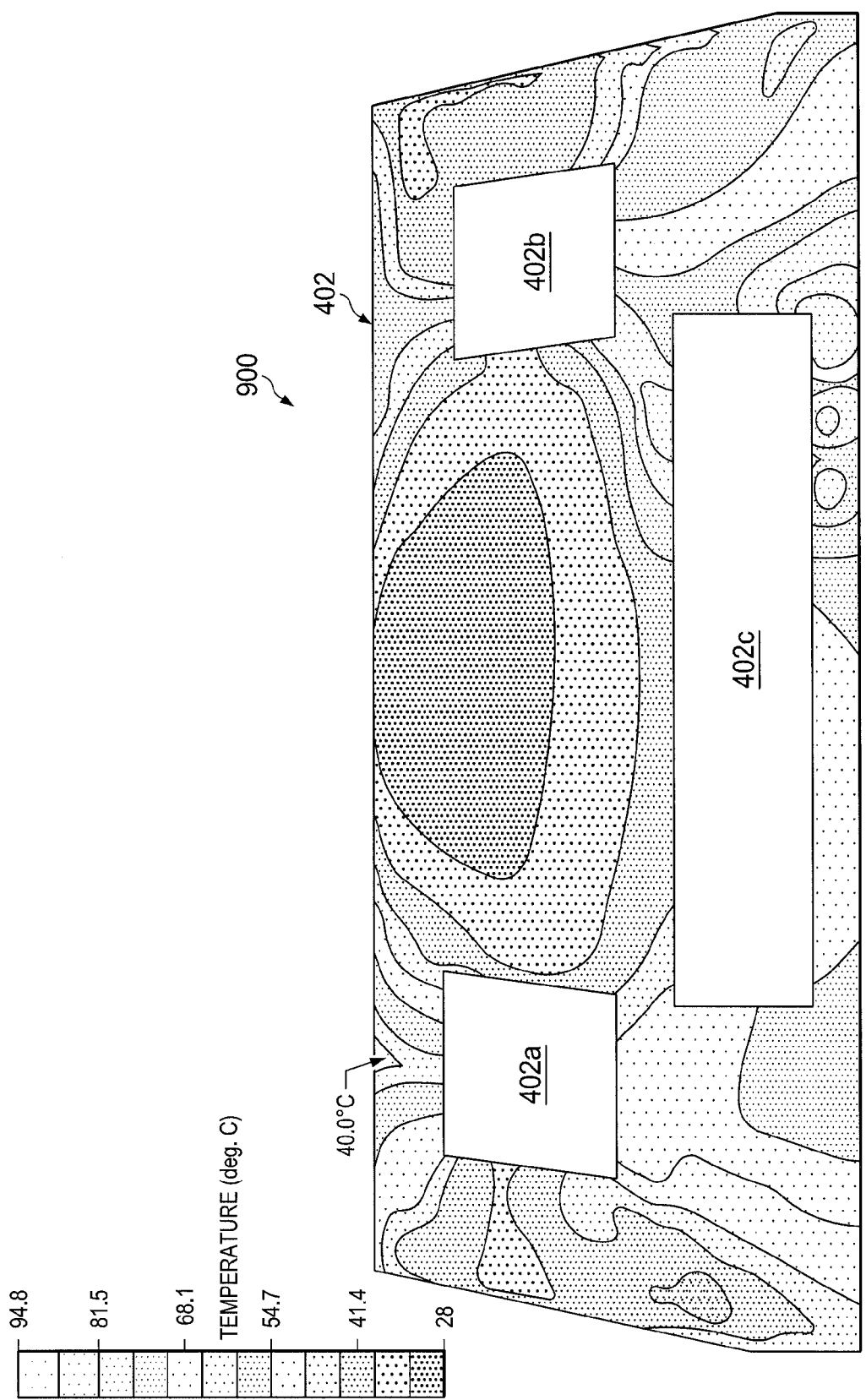
FIG. 9 is a temperature map illustrating an experimental embodiment of a wall of the IHS of FIG. 2 that incorporates the cooling system of FIG. 4.

FIG. 9 illustrates a temperature map 900 of a wall (e.g., a bottom wall) on the base portion 402 of the IHS 400 of FIG. 4 with the graphics processor (406) performing the processing-intensive operation discussed above with reference to FIG. 7. Similarly as discussed above for FIG. 8, the base portion 402 includes a plurality of vent sections 402a, 402b, and 402c used, for example, to provide for an airflow into the base portion 402 to the system processor (406) and fans 420 and 424. As such, there is no temperature data for those sections of the wall on the base portion 402. As can be seen in FIG. 9, a section of the wall on the base portion 402, which is located adjacent the vent section 402a and immediately adjacent the first finned heat sink 408 in the base portion 402, increases in temperature to approximately 40.0 degrees C. during the operation of the system processor (406). Thus, as can be seen by comparing the temperature maps 800 and 900 of FIGS. 8 and 9, respectively, the component cooling system of the present disclosure operates to reduce the temperatures produced by the components in the IHS to reduce temperatures on the user engagement surfaces of the IHS. In the experimental embodiments illustrated in FIGS. 8 and 9, the component cooling system operated to reduce the temperature at a similar point on the back wall of the base portion of the IHS by 7.3-7.5 degrees C. when performing substantially similar processing operations.

Figure 10:
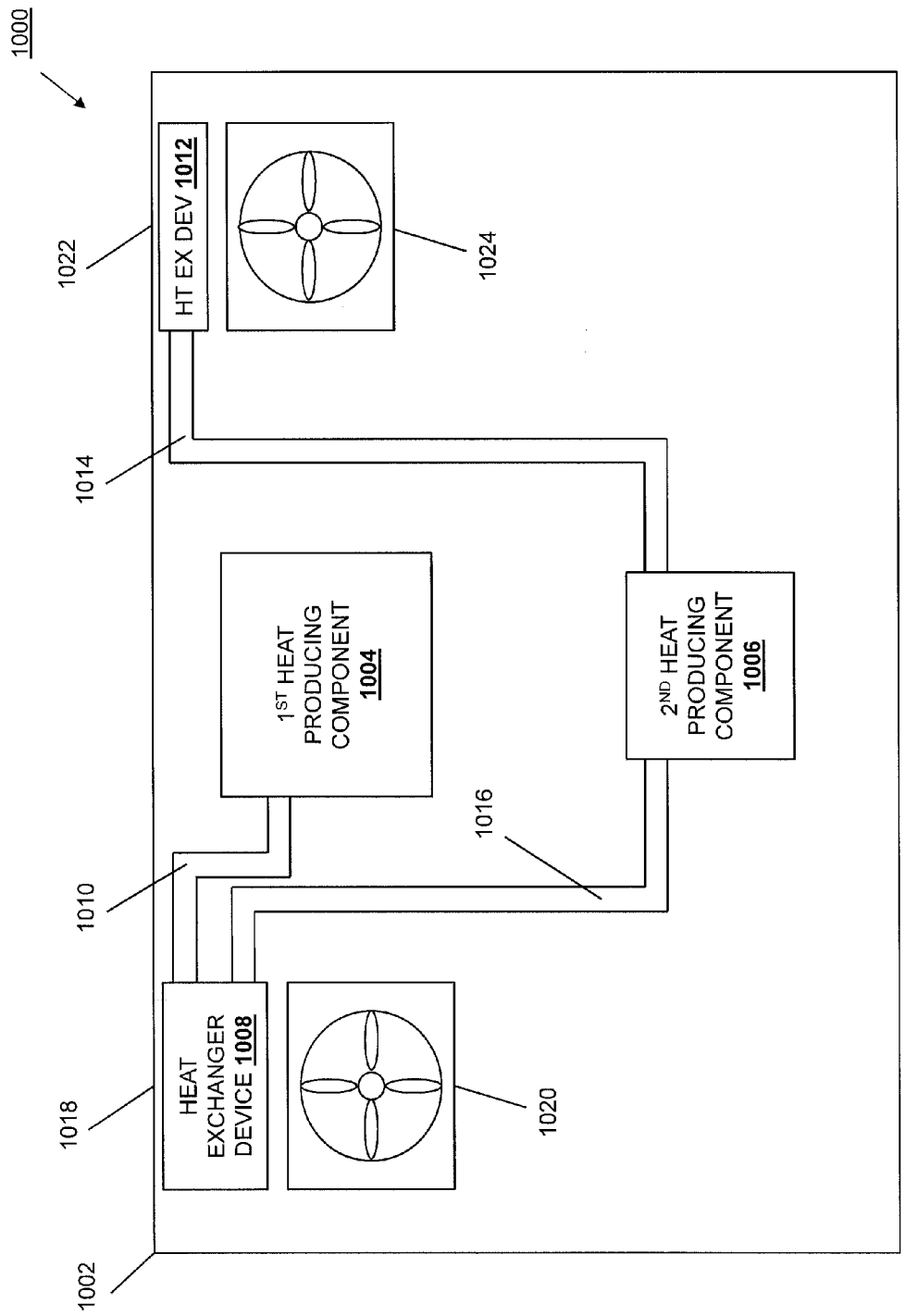
FIG. 10 is a schematic view illustrating an embodiment of a cooling system according to the teachings of the present disclosure

Referring now to FIG. 10, an alternative embodiment of an IHS 1000 is illustrated that is similar to the IHS 400 discussed above with reference to FIG. 4, but provides for the sharing of the thermal load of the first heat producing component with the second heat producing component. The portion of the IHS 1000 illustrated in FIG. 10 includes a base portion 1002 that may be, for example, the base portion 202 discussed above with reference to FIG. 2. As discussed above, the base portion 1002 may house a variety of IHS components. For example, FIG. 10 illustrates the base portion 1002 of the IHS 1000 housing a first heat producing component 1004 and a second heat producing component 1006 each connected to a cooling system. In an embodiment, the first heat producing component 1004 may be a first IHS component such as, for example, a system processor, a graphics processor, a memory device, a power supply system, and/or a variety of other heat producing IHS components known in the art. Similarly, the second heat producing component 1006 may be a second IHS component such as, for example, a system processor, a graphics processor, a memory device, a power supply system, and/or a variety of other heat producing IHS components known in the art.

In the illustrated embodiment, the cooling system includes a first heat exchanger device 1008 that is thermally connected to the first heat producing component 1004 by a first thermal connection 1010 and thermally connected to the second heat producing component 1006 by a second thermal connection 1016. A second heat exchanger device 1012 is thermally connected to the second heat producing component 1006 by a third thermal connection 1014. In an embodiment, the first heat exchanger device 1008 and/or the second heat exchanger device 1012 may include IHS heat sinks, double pipe heat exchangers, shell and tube heat exchangers, plate heat exchangers, plate and shell heat exchangers, adiabatic wheel heat exchangers, plate fin heat exchangers (e.g., micro channel fin, louvered fin, dimple fin, and/or other plate fin heat exchangers known in the art), pillow plate heat exchangers, fluid heat exchangers, waste heat recovery units, dynamic scraped surface heat exchangers, phase change heat exchangers, direct contact heat exchangers, spiral heat exchangers, and/or a variety of other heat exchanger devices known in the art.

In an embodiment, the first thermal connection 1010, the second thermal connection 1014, and/or the third thermal connection 1016 may include heat pipes, heat pins, and/or other heat-transfer devices known in the art. In some embodiments, any of the thermal connections 1010, 1014, and 1016 may be replaced with a direct thermal connection to the first heat exchanger device 1008 or the second heat exchanger device 1012. For example, the second heat producing component 1004 may be directly thermally connected to the second heat exchanger device 1012 (e.g., a heat sink positioned on and thermally coupled a processor via a thermal paste) and thermally connected to the first heat exchanger device 1008 through the second thermal connection 1016, with the first heat producing component 1004 thermally connected to the first heat exchanger device 1008 through the first thermal connection 1010. In some embodiments, any or all of the thermal connections 1010, 1014, and 1016 may include multiple heat transfer components such as, for example heat pins, heat pipes, heat exchangers, and/or other heat transfer components known in the art. The first heat exchanger device 1008 is positioned between a vent 1018 on the base portion 1002 and a fan 1020. The second heat exchanger device 1012 is positioned between a vent 1022 on the base portion 1002 and a fan 1024. However, in some embodiments, the fans 1020 and 1024 may be omitted (e.g., when the cooling requirements of the first heat producing component 1004 and the second heat producing component 1006 may be satisfied by the first heat exchanger device 1008 and the second heat exchanger device 1012 without the need for airflows provided by fans). One of skill in the art in possession of the present disclosure will recognize how the component cooling system in the IHS 1000 may operate substantially similarly to the component cooling system in the IHS 400, discussed above, to provide for the sharing of the thermal load produced by the first heat producing component 1004 with the second heat producing component 1006.

While the embodiments discussed above focus on component cooling systems having two components, one of skill in the art in possession of the present disclosure will recognize how the teachings of the present disclosure may be extended to any number of components in a wide variety of configurations while remaining within the scope of the present disclosure. For example, with reference to FIG. 4, additional heat producing components could be thermally connected to the first heat exchanger device 408. In another example, a third heat producing component could be thermally connected to the second heat exchanger device 412. In yet another example, the first heat producing component 404 could be coupled to a third heat exchanger device. Combinations of these and other modifications stemming from the teachings of the present disclosure allow those teachings to provide for component level thermal load sharing across any number of components in a system.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A component cooling system, comprising:
a chassis including an outer surface and a plurality of vents allowing air to pass through the chassis;
a first heat sink located in the chassis and adjacent to a first one of the vents;
a second heat sink located in the chassis and adjacent to a second one of the vents;
a plurality of heat producing components located in the chassis, the plurality of heat producing components including a first heat producing component and a second heat producing component;
wherein the first heat producing component is directly connected to a first heat pipe that extends between the first heat producing component and the first heat sink such that the first heat sink is not adjacent to the first heat producing component, and that is directly connected to a second heat pipe that extends between the first heat producing component and the second heat sink such that the second heat sink is not adjacent to any of the heat producing component, and
wherein the second heat producing component is directly connected to a third heat pipe that extends between the second heat producing component and the first heat sink such that the first heat sink is not adjacent to any of the heat producing components,
wherein the first heat sink and the second heat sink are configured to dissipate heat that is produced by the first heat producing component and the second heat producing component and conducted through the first heat pipe, the second heat pipe, and the third heat pipe, and
wherein the configuration of the third heat pipe, the first heat sink, the first heat pipe, the first heat producing component, the second heat pipe, and the second heat sink provides for the dissipation of the heat by the first heat sink and the second heat sink as well as the conduction of the heat that is produced by the second heat producing component sequentially through the third heat pipe, the first heat sink, the first heat pipe, the first heat producing component, the second heat pipe, and the second heat sink while ensuring that no portion of the outer surface of the chassis exceeds a predetermined temperature.

2. The multi-component cooling system of claim 1, further comprising: a fan located adjacent to the first heat sink and configured to provide an airflow through the first sink.

3. The multi-component cooling system of claim 1, further comprising: a fan located adjacent to the second heat sink and configured to provide an airflow through the second heat sink.

4. The multi-component cooling system of claim 1, wherein the first heat producing component includes one of a system processor and graphics processor.

5. The multi-component cooling system of claim 4, wherein the second heat producing component includes another of the system processor and the graphics processor.

6. The multi-component cooling system of claim 1, wherein the first heat sink includes a plurality of first fins and the second heat sink includes a plurality of second fins.

7. The multi-component cooling system of claim 1, wherein the predetermined temperature is less than 42° Celsius.

8. An information handling system (IHS) comprising:
a chassis including a plurality of vents allowing air to pass through the chassis;
a first heat sink located in the chassis and adjacent to a first one of the vents;
a second heat sink located in the chassis and adjacent to a second one of the vents; and
a plurality of heat producing components located in the chassis, the plurality of heat producing components including a graphics processor and a system processor;
wherein one of the graphics processor and the system processor is:
directly connected to a first heat pipe that extends between the one of the graphics processor and the system processor and the first heat sink such that the first heat sink is not adjacent to any of the heat producing components; and
directly connected to a second heat pipe that extends between the one of the graphics processor and the system processor and the second heat sink such that the second heat sink is not adjacent to any of the heat producing components; and
wherein another of the graphics processor and the system processor is directly connected to a third heat pipe that extends between the another of the graphics processor and the system processor and the first heat sink such that the first heat sink is not adjacent to any of the heat producing components,
wherein the first heat sink and the second heat sink are configured to dissipate heat that is produced by the graphics processor and the system processor and conducted through the first heat pipe, the second heat pipe, and the third heat pipe; and
wherein the configuration of the third heat pipe, the first heat sink, the first heat pipe, the one of the graphics processor and the system processor, the second heat pipe, and the second heat sink provides for the dissipation of the heat by the first heat sink and the second heat sink as well as the conduction of the heat that is produced by the another of the graphics processor and the system processor sequentially through the third heat pipe, the first heat sink, the first heat pipe, the one of the graphics processor and the system processor, the second heat pipe, and the second heat sink while ensuring that no portion of a user engagement surface on the chassis exceeds a predetermined temperature.

9. The IHS of claim 8, further comprising: a fan located in the chassis and adjacent to the first heat sink, wherein the fan is configured to provide an airflow through the first heat sink.

10. The IHS of claim 8, further comprising: a fan located in the chassis and adjacent to the second heat sink, wherein the fan is configured to provide an airflow through the second heat sink.

11. The IHS of claim 8, wherein the system processor produces a temperature of over 85° Celsius during operation.

12. The IHS of claim 11, wherein the predetermined temperature is less than 42° Celsius during operation of the system processor.

13. The IHS of claim 8, wherein the first heat sink includes a plurality of fins.

14. The IHS of claim 8, wherein the second heat sink includes a plurality of fins.

15. A method for cooling an information handling system (IHS), comprising:
providing a chassis including a plurality of vents allowing air to pass through the chassis
providing a plurality of first heat producing components located in the chassis to produce heat, the plurality of heat producing components including a first heat producing component and a second heat producing component, wherein the first heat producing component is:
   directly connected to a first heat pipe that extends between the first heat producing component and a first heat sink located in the chassis and adjacent to a first one of the vents such that the first heat sink is not adjacent to any of the heat producing components; and
   directly connected to a second heat pipe that extends between the first heat producing component and a second heat sink located in the chassis and adjacent to a second one of the vents such that the second heat sink is not adjacent to any of the heat producing components;
operating the second heat producing component to produce heat, wherein the second heat producing component is:
   directly connected to a third heat pipe that extends between the second heat producing component and the first heat sink such that the first heat sink is not adjacent to any of the heat producing components;
dissipating heat produced by the first heat producing component and the second heat producing component using the first heat sink and the second heat sink;
conducting the heat produced by the second heat producing component through the third heat pipe to the first heat sink;
conducting the heat from the first heat sink through the first heat pipe to the first heat producing component; and
conducting the heat from the first heat producing component through the second heat pipe to the second heat sink;
wherein the configuration of the third heat pipe, the first heat sink, the first heat pipe, the first heat producing component, the second heat pipe, and the second heat sink provides for the dissipation of the heat by the first heat sink and the second heat sink as well as the conduction of the heat that is produced by the second heat producing component sequentially through the third heat pipe, the first heat sink, the first heat pipe, the first heat producing component, the second heat pipe, and the second heat sink while ensuring that no portion of an outer surface of the chassis exceeds a predetermined temperature.

16. The method of claim 15, further comprising: providing an airflow through the first heat sink using a fan located in the chassis.

17. The method of claim 15, further comprising: providing an airflow through the second heat sink using a fan located in the chassis.

18. The method of claim 15, wherein the first heat producing component includes one of a system processor and graphics processor.

19. The method of claim 18, wherein the second heat producing component includes another of the system processor and the graphics processor.

20. The method of claim 15, wherein the predetermined temperature is less than 42° Celsius.

* * * * *